United States Patent
Hartman et al.

(10) Patent No.: US 11,847,270 B2
(45) Date of Patent: Dec. 19, 2023

(54) DEVICE MENU CONTROLS CONNECTOR

(71) Applicant: Endress+Hauser SE+Co. KG, Maulburg (DE)

(72) Inventors: Brian Hartman, Greenwood, IN (US); Gautham Karnik, Whitestown, IN (US); Matthew Krygier, Noblesville, IN (US); Tareq Al Qaisi, Plainfield, IN (US)

(73) Assignee: Endress+Hauser SE+Co. KG, Maulburg (DE)

( * ) Notice: Subject to any disclaimer, the term of this patent is extended or adjusted under 35 U.S.C. 154(b) by 248 days.

(21) Appl. No.: 17/536,395

(22) Filed: Nov. 29, 2021

(65) Prior Publication Data
US 2023/0168753 A1 Jun. 1, 2023

(51) Int. Cl.
*G01D 5/00* (2006.01)
*G01D 5/249* (2006.01)
*G05G 1/02* (2006.01)
*G06F 3/0362* (2013.01)
*G01D 5/14* (2006.01)

(52) U.S. Cl.
CPC .......... *G06F 3/0362* (2013.01); *G01D 5/00* (2013.01); *G01D 5/142* (2013.01); *G01D 5/249* (2013.01); *G05G 1/02* (2013.01)

(58) Field of Classification Search
CPC ........ G06F 3/0362; G01D 5/00; G01D 5/142; G01D 5/249; G01D 21/00; G01D 11/245; G01D 5/145; G05G 1/02; G01P 3/487; H03K 17/9517; H03K 2217/94068
See application file for complete search history.

(56) References Cited

U.S. PATENT DOCUMENTS

| | | | | |
|---|---|---|---|---|
| 5,560,462 | A * | 10/1996 | Gustin | G01P 1/00 324/207.2 |
| 5,936,613 | A * | 8/1999 | Jaeger | G02F 1/13306 345/184 |
| 6,900,406 | B2 * | 5/2005 | Huber | G05G 1/02 200/566 |

(Continued)

FOREIGN PATENT DOCUMENTS

| | | | |
|---|---|---|---|
| DE | 102005034957 A1 * | 2/2007 | ......... H01H 36/0066 |
| DE | 102008023651 A1 | 11/2009 | |

(Continued)

*Primary Examiner* — Temesghen Ghebretinsae
*Assistant Examiner* — Karin Kiyabu
(74) *Attorney, Agent, or Firm* — Mark A. Logan; Endress+Hauser (USA) Holding, Inc.

(57) ABSTRACT

A device menu controls connector for a process automation field device include a field device part and a removable knob assembly. The field device part includes one or more Hall effect sensors, and the knob assembly includes one or more magnets. When the knob assembly is attached to the field device part, the knob may be rotated clockwise or counter-clockwise, or may be pushed or pulled. The interaction of the magnets and Hall effect sensors allow the field device to sense the rotation and the pushing and pulling of the knob. The programming of the field device allows the device menu controls connector to simulate <Up>, <Down>, <Right>, <Left>, <Enter>, and <Esc> key presses of a user interface. A field device having such a device menu controls connector is also disclosed.

8 Claims, 5 Drawing Sheets

(56) References Cited

U.S. PATENT DOCUMENTS

| | | | | |
|---|---|---|---|---|
| 8,328,577 | B1* | 12/2012 | Lu | H01R 9/05 |
| | | | | 439/578 |
| 8,490,513 | B2* | 7/2013 | Chiou | F16C 1/102 |
| | | | | 277/606 |
| 10,510,501 | B2* | 12/2019 | Kubes | H01H 89/00 |
| 11,181,863 | B2* | 11/2021 | Ely | G04G 21/08 |
| 11,194,298 | B2* | 12/2021 | Roach | G04G 21/025 |
| 11,385,671 | B2* | 7/2022 | Robl | H03M 1/24 |
| 2012/0256821 | A1* | 10/2012 | Olsson | G06F 3/0338 |
| | | | | 345/156 |

FOREIGN PATENT DOCUMENTS

| | | | | |
|---|---|---|---|---|
| DE | 102017117906 A1 | * | 2/2019 | |
| EP | 844325 A2 | * | 5/1998 | B60K 37/06 |
| KR | 102283678 B1 | * | 7/2021 | |
| WO | WO-9808449 A1 | * | 3/1998 | A61B 17/00 |
| WO | 2005066986 A1 | | 7/2005 | |

* cited by examiner

DEVICE MENU CONTROLS CONNECTOR

TECHNICAL FIELD

The present disclosure relates generally to a removable knob assembly for a field device for use in process automation systems.

BACKGROUND

Process automation field devices may be discrete devices used in a process automation system for the measurement of some physical phenomena. In a conventional field device, the field device may include electronics such as a microcontroller, memory, transducers, and analog-to-digital converters. The field device may include digital and analog outputs, for example, a 4-20 mA current output or a 1-5 V voltage output. The field device may include one or more digital communication interfaces. The field device may include a graphical display for displaying the field device's user interface (UI) that may show measured values, field device status, menus and menu navigation, etc. The field device may further include pushbuttons, dials, or similar for navigating the field devices user interface. All of these field device components may be enclosed within a field device housing.

Field devices may be used in hazardous locations where inflammable or explosive gases may be present. Field devices may be used in environments where there may be significant moisture, salt water spray, or corrosive chemicals, for example. A field device used in such an environment may be completely, hermetically sealed against the environment, and the such sealing may include sealing the user interface controls inside of the field device's housing underneath of a screw cap. For a technician to service the field device, where such servicing may include UI menu navigation to read diagnostic values and to read and set parameter values, for example, the technician may need to open the field device housing by unscrewing the cap that encloses the user interface controls. Such opening of the field device may be impractical in many installations and environments, and it may be forbidden when the field device is installed in an area where inflammable or explosive gases may be present. Therefore, in a field device installed in an environment where the field device must be explosion-safe, it is desirable navigate the field device's UI without needing to open the field device to access the field device's UI controls.

SUMMARY

Accordingly, there remains a need for further contributions in this area of technology. According to at least one embodiment of the disclosure, a device menu controls connector comprises a field device part that includes a cylindrical hollow body having an open first end, a closed second end, a flange disposed circumferentially about the hollow body between the first end and the second end, and a first locking means disposed at the second end; an elastomer sealing ring disposed circumferentially about the hollow body adjacent to a side of the flange facing the first end; a printed circuit board (PCB) having at least one Hall effect sensor, the PCB disposed inside the hollow body such that the at least one Hall effect sensor is adjacent to an inside face of the closed second end; and a plurality of conductors extending from the PCB and embodied to carry electrical signals between the PCB and electronic circuits of a process automation field device. The field device part is embodied to thread at the first end into a cable gland of the process automation field device until the flange contacts the cable gland and compresses the elastomer sealing ring to seal the cable gland.

The device menu controls connector further comprises a knob assembly that includes a cylindrical sleeve having an open first end, a partially closed second end, and a second locking means disposed inside the first end, wherein the second locking means is complementary to the first locking means; a cylindrical knob having an open first end, a closed second end, and a shaft disposed along an axis of rotation of the knob and extending from the closed second end into an interior of the knob; a first coil spring and a second coil spring disposed about the shaft; a retainer disposed at a distal end of the shaft; and at least one magnet disposed on the retainer. The sleeve and knob are assembled such that the first end of the knob fits over at least partially the second end of the sleeve and the axis of rotation of the knob coincides with an axis of rotation of the sleeve; the shaft of the knob extends into the partially closed second end of the sleeve, the first spring is disposed between the retainer and an interior face of the second end of the sleeve, and the second spring is disposed between an exterior face of the second end of the sleeve and an interior face of the second end of the knob. The knob may rotate freely about the sleeve and may move axially with respect to the sleeve. An axial movement of the knob away from the sleeve compresses the first spring between the retainer and the interior face of the second end of the sleeve. An axial movement of the knob toward the sleeve compresses the second spring between the exterior face of the second end of the sleeve and the interior face of the second end of the knob. The knob assembly is embodied to releasably lock onto the field device part via the first locking means and the second locking means, and the releasable locking is such that the sleeve of the knob assembly does not move with respect to the hollow body of the field device part. When the knob assembly is releasably locked onto the field device part the at least one magnet is disposed near the at least one Hall effect sensor such that movement of the knob triggers the at least one Hall effect sensor.

In an embodiment of the device menu controls connector, the PCB includes a plurality of Hall effect sensors: all but one of the plurality of Hall effect sensors are disposed equidistantly along a circumference of a circle, and one Hall effect sensor is disposed in a center of the circle. The retainer includes a plurality of magnets equal in number to the plurality of Hall effect sensors, and all but one of the magnets are disposed along a circumference of a circle on the retainer with one magnet disposed in a center of the circle on the retainer. The circumferences of the two circles are equal, centers of the two circles coincide, and the centers of the two circles coincide with the axis of rotation of the knob, and the polarity of the magnets disposed along the circle on the retainer alternates between north and south along the circumference of the circle.

In an embodiment of the device menu controls connector, the at least one Hall effect sensor is an integrated circuit (IC) containing a plurality of Hall effect sensors, the at least one magnet is a diametrically polarized magnet, and the IC and the diametrically polarized magnet are disposed on the axis of rotation of the knob.

In an embodiment of the device menu controls connector, when the knob assembly is releasably attached to the field device part and the knob is rotated with respect to the field device part clockwise about the knob's axis, the at least one Hall effect sensor encodes a first pulse train and sends the first pulse train to the field device via the plurality of conductors, and when the knob assembly is releasably attached to the field device part and the knob is rotated with respect to the field device part counter-clockwise about the knob's axis, the at least one Hall effect sensor encodes a second pulse train different from the first pulse train and sends the second pulse train to the field device via the plurality of conductors.

In an embodiment of the device menu controls connector, when the knob assembly is releasably attached to the field device part and the knob is pushed axially toward the field device part, the at least one Hall effect sensor encodes a push signal and sends the push signal to the field device via the plurality of conductors, and when the knob assembly is releasably attached to the field device part and the knob is pulled axially away from the field device part, the at least one Hall effect sensor encodes a pull signal and sends the pull signal to the field device via the plurality of conductors.

According to at least one embodiment of the present disclosure, a process automation field device comprises a control electronics including a microcontroller and a memory; a display embodied to display a text or graphical user interface (UI); a housing having a window and a cable gland, wherein the housing encloses the control electronics and the display, and wherein the display is visible via the window; and a field device part of a device menu controls connector, the field device part including a cylindrical hollow body having an open first end, a closed second end, a flange disposed circumferentially about the hollow body between the first end and the second end, and a first locking means disposed at the second end; an elastomer sealing ring disposed circumferentially about the hollow body adjacent to a side of the flange facing the first end; a printed circuit board (PCB) having at least one Hall effect sensor, the PCB disposed inside the hollow body such that the at least one Hall effect sensor is adjacent to an inside face of the closed second end; and a plurality of conductors extending from the PCB and embodied to carry electrical signals between the PCB and the control electronic of the field device. The field device part is threaded at the first end into the cable gland and the flange contacts the cable gland and compresses the elastomer sealing ring to seal the cable gland.

In an embodiment, the field device is programmed to process a first pulse train encoded by the at least one Hall effect sensor as a rightward or a downward navigation of the field device's UI, a second pulse train encoded by the at least one Hall effect sensor and different from the first pulse train as a leftward or an upward UI navigation, an increasing magnetic field as encoded by the at least one Hall effect sensor as an <Enter> or <Select> UI navigation, and a decreasing magnetic field as encoded by the at least one Hall effect sensor as an <Escape> or <Back> UI navigation.

In an embodiment of the field device, the field device is further programmed to detect an attachment of a knob assembly to the field device part by detecting a triggering of the at least one Hall effect sensor by at least one magnet, the knob assembly including a cylindrical sleeve embodied to removably attach to the field device part; a cylindrical knob having an axis of rotation, the knob disposed about the sleeve and embodied to rotate with respect to the sleeve about the knob's axis of rotation and to move axially with respect to the sleeve along the knob's axis of rotation; and at least one magnet disposed on the knob such that when the knob assembly is removably attached to the field device part, the at least one magnet is disposed adjacent to the closed second end of the cylindrical hollow body and the PCB disposed therein. The field device is further programmed to detect a removal of the knob assembly by detecting an absence of triggering of the at least one Hall effect sensor for a predetermined absence time, to enable and display the field device's UI when the field device detects the attachment of the knob assembly, and to disable the field device's UI when the field device detects the removal of the knob assembly.

DETAILED DESCRIPTION

Disclosed herein is a device menu controls connector that may connect with a process automation field device and may be used for navigating and interacting with the field device's user interface. Also disclosed is a process automation field device embodied to connect with the device menu controls connector. Various embodiments of the disclosed devices will now be presented in conjunction with the figures that illustrate the embodiments. It will be understood that no limitation of the scope of this disclosure is thereby intended.

Figure 1A:
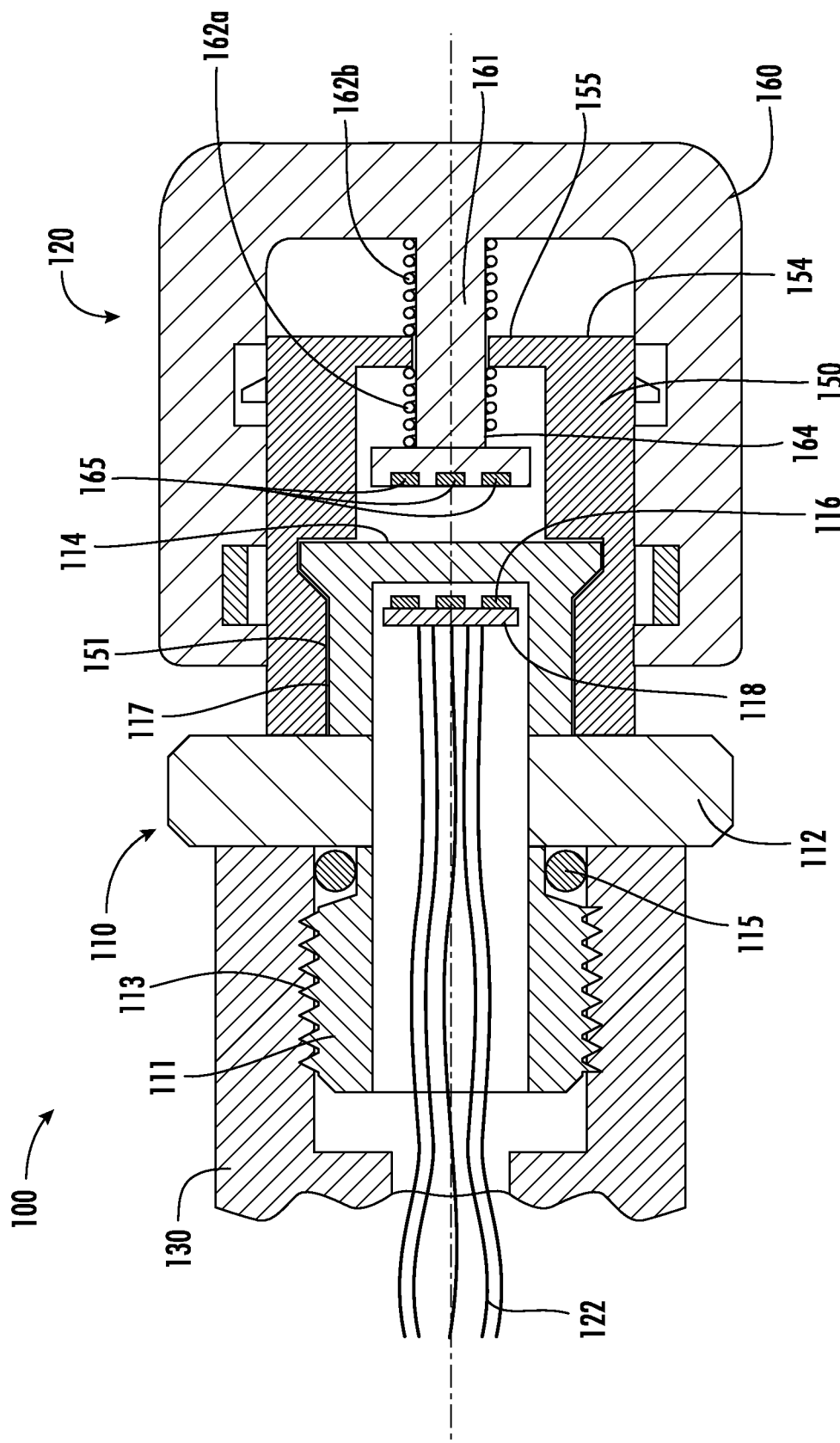
FIG. 1A shows sectional view of a device menu controls connector according to an embodiment of the present disclosure wherein the knob is in a neutral position.

FIG. 1A shows a device menu controls connector 100 according to an embodiment of the present disclosure. The device menu control connector 100 may include a field device connection 110 that is embodied to attach to a field device. The device menu controls connector 100 may also include a knob assembly 120 that is removably attachable to the field device connection 110.

The field device connection 110 may include a cylindrical, hollow body 111 embodied of a non-magnetic material, for example, aluminum, stainless steel, or a plastic. The hollow body 111 may have a first end embodied connect with a cable gland 130 of a field device housing. The hollow body 111 may have male threads 113 cut into the first end, and the male threads 113 may correspond to complementary female threads of the cable gland 130 Thus the hollow body 111 may screw into the cable gland 130 of the field device housing. The hollow body 111 may have a second end having a closed end face 114.

The field device connection 110 may further include a flange 112 and a sealing ring 115 for sealing the cable gland when the field device connection 110 is screwed into the cable gland 130. In the installed state, the flange 112 may compress the sealing ring 115 such that the cable gland is sealed against the ingress of any liquid or gas. The flange 112 of the field device connection 110 may be disposed midway along the hollow body 111 such that the first end of the hollow body 111 may protrude into the cable gland 130 and the second end of the hollow body 111 may extend outward from the cable gland and thus outward from the field device housing.

The field device connection 110 may include a locking means 117 disposed on the outside of the second end of the hollow body 111. The locking means may include ball detents, threads for quarter-turn locking, a snap ring groove, or pins for a bayonet mounting or similar such locking means that will allow the knob assembly 120 to releasably attach to the field device connection 110.

The field device connection 110 may include a printed circuit board (PCB) 118 disposed within the hollow body 111 adjacent to the end face 114 of the hollow body 111. The PCB 118 may include one or more Hall effect sensors 116 disposed on a side of the PCB 118 facing the inside of the closed end face 114.

Figure 2:
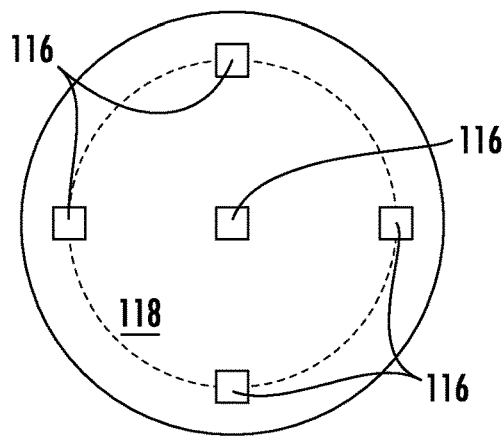
FIG. 2 shows schematically a printed circuit board having five Hall effect sensors.

In embodiments of the field device connection 110 in which the PCB 118 includes a plurality of Hall effect sensors 116, the Hall effect sensors 116 may be disposed on the PCB 118 equidistantly along the circumference of a circle. In addition to the plurality of Hall effect sensors 116 disposed along the circle on the PCB 118, one additional Hall effect sensor 116 may be disposed in the center of the circle on the PCB 118. FIG. 2. shows an embodiment of the PCB 118 on which five Hall effect sensors 116 are disposed: four of the Hall effect sensors are disposed along a circle on the PCB 118, and the fifth Hall effect sensor 116 is disposed in the center of the circle. Not shown in FIG. 2 are any conductive traces of the PCB 118 nor any connectors or cables which may connect the PCB 118 with other circuits.

Figure 3:
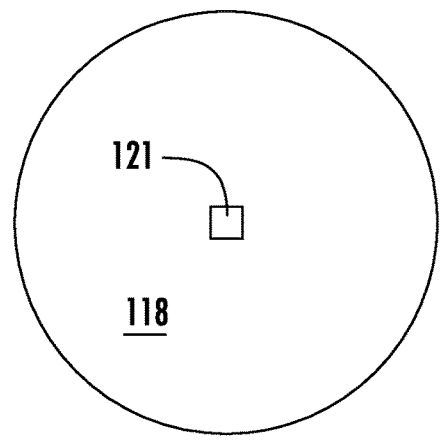
FIG. 3 shows schematically an embodiment of the printed circuit board having a monolithic integrated circuit.

In an alternate embodiment, there may be just one monolithic integrated circuit (IC) 121 on the PCB in place of the plurality of Hall effect sensors 116, and that IC 121 may contain a plurality of Hall effect sensors within it. In this embodiment, it is not necessary that there are also Hall effect sensors 116 disposed along a circle on the PCB 118. FIG. 3 shows an embodiment of the PCB 118 on which the monolithic IC 121 is disposed.

The field device connection 110 may include a plurality of wires 122, or a ribbon cable, for example, that connect with the PCB 118 and extend through the hollow body 111 to connect with a mating connector within the field device. Via the wires 122, the field device may receive signals from the Hall effect sensors 116 (or from the IC 121) and other components on the PCB 118.

The knob assembly 120 may include a sleeve 150 and a knob 160 that are assembled together. The sleeve 150 and the knob 160 are each embodied as hollow cylinders and are assembled together such that the axes of the two cylinders coincide. The inner diameter of the knob 160 is larger than the outer diameter of the sleeve 150 so that the knob 160 may fit over and rotate about the sleeve 150 about the two shared axes. In addition, the knob 160 may move along its axis (i.e., axially) relative to the sleeve 150. This axial movement may be a result of a user pulling the knob 160 axially away from the sleeve 150 or a result of the user pushing the knob 160 axially toward the sleeve 150.

The sleeve 150 may have an open first end embodied to fit over and removably attach to the second end of the hollow body 111 of the field device connection 110. Disposed on an inside circumference of the first end of the sleeve 150 may be a locking means 151 complementary to the locking means 117 disposed on the outside of the second end of the hollow body 111. For example, if the locking means 117 disposed on the outside of the second end of the hollow body 111 includes quarter-turn threads, then disposed on the inside circumference of the first end of the sleeve 150 are complementary quarter-turn threads such that the hollow body 111 and the sleeve 150 may removably lock together via the complementary quarter-turn threads on each respective body. Likewise, if the hollow body 111 includes ball detents disposed on the outside of the second end of the hollow body 111 as the locking means 117, then the first end of the sleeve 150 may include grooves or depressions into which the ball bearings of the ball detents of the hollow body 111 may fit to removably lock the sleeve 150 to the hollow body 111. Likewise, if the hollow body 111 includes pins for a bayonet-type connection disposed on the outside of the hollow body 111 as the locking means 117, the sleeve 150 may include grooves machined into the inner circumference of the sleeve 150 corresponding to the pins of the hollow body 111 so that the sleeve 150 may fit over and removably lock into the hollow body 111 in a bayonet-type connection. The complementary locking means 151 for the hollow body 111 and the sleeve 150 are not limited to the given examples, but may include other locking means as is known in the art.

When the sleeve 150 is removably attached to the second end of the hollow body 111, the sleeve 150 and the hollow body 111 do not move relative to each other except when removing the sleeve 150 from the hollow body 111.

The sleeve 150 of the knob assembly 120 may further have a second end closed by an end face 154 but having a circular opening 155 through the end face 154.

The knob 160 may have an open first end and a closed second end, and may have a cylindrical shaft 161 disposed on an interior side of the closed second end and extending interior to the knob 160. The cylindrical shaft 161 may be disposed along the cylindrical axis of the knob 160. The diameter of the cylindrical shaft 161 and the diameter of the circular opening 155 may be dimensioned such that the shaft 161 may be disposed through the opening 155, and the shaft 161 may rotate about its axis within opening 155 and the shaft may move axially through the opening 155. That is, the shaft 161 may rotate about its axis or move axially while the shaft 161 is disposed within the opening 155.

The knob 160 may further include a first spring 162a and a second spring 162b both disposed about the cylindrical shaft 161. The second spring 162b may be disposed about the cylindrical shaft 161 between the inner face of the knob 160 from which the cylindrical shaft 161 extends and the outer face 154 of the sleeve 150. The second spring 162b may be disposed such that an axial movement of the knob 160 toward the sleeve 150 compresses the second spring 162b between the inner face of the knob 160 and the outer face 154 of the sleeve 150. The first spring 162a may be disposed about the cylindrical shaft 161 between an inside of end face 154 and a retainer 164 that is disposed on the cylindrical shaft 161. The first spring 162a is disposed such that an axial movement of the knob 160 away from the sleeve 150 compresses the first spring 162a between retainer 164 and the inner face of the end face 154 of the sleeve 150. Thus, the two springs 162a, 162b are embodied and disposed to return the knob 160 to a neutral position when the knob 160 is moved axially toward or away from the sleeve 150.

Figure 1B:
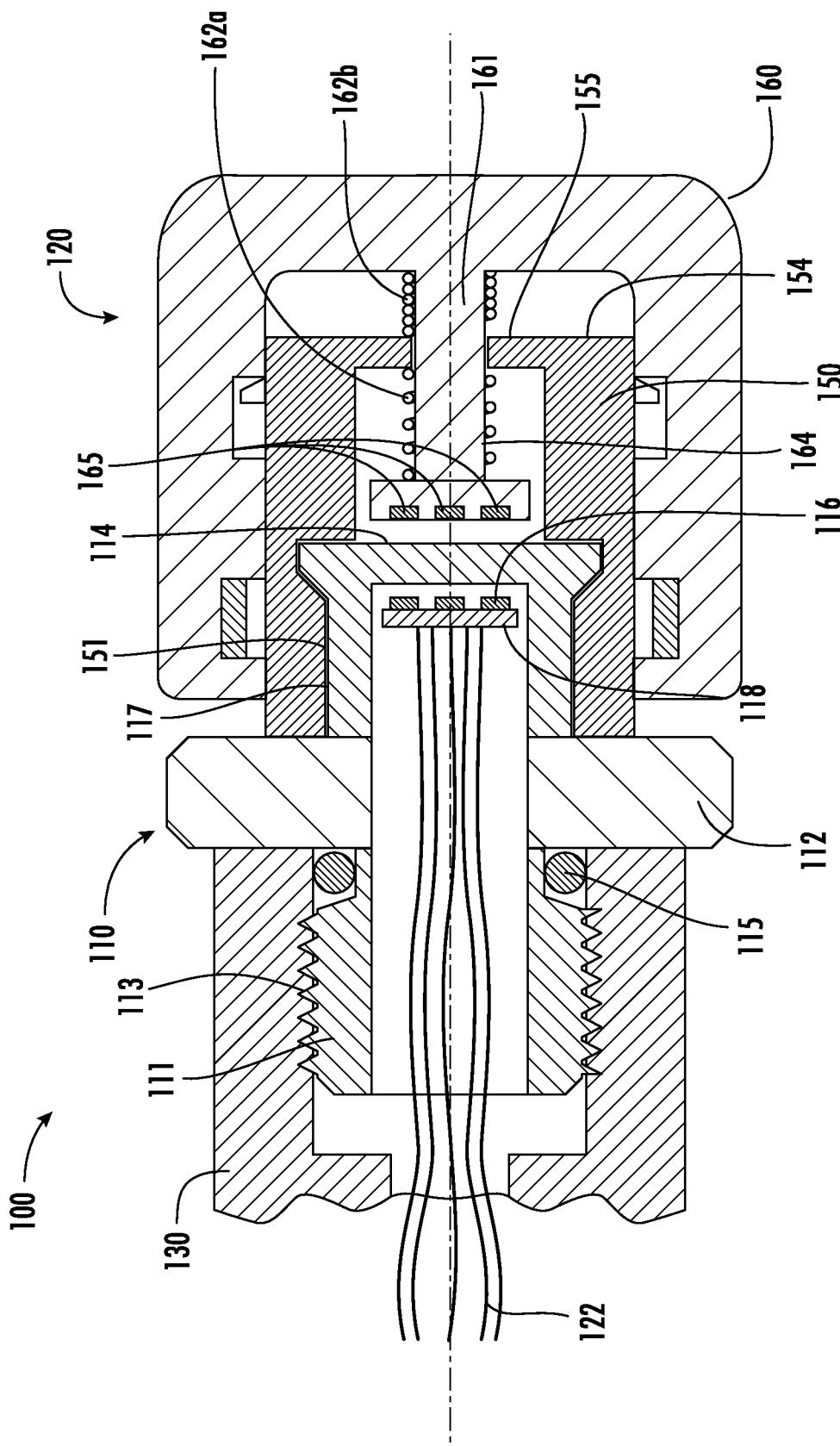
FIG. 1B shows a sectional view of a device menu controls connector according to an embodiment of the present disclosure wherein the knob is in a pushed position.

Shown in FIG. 1B is an embodiment of the device menu controls connector 100 in which the knob 160 of the knob assembly 120 has been pressed, or pushed, toward the field device connection 110. Note the field device connection 110 and the knob assembly 120 remain releasably locked together.

Figure 1C:
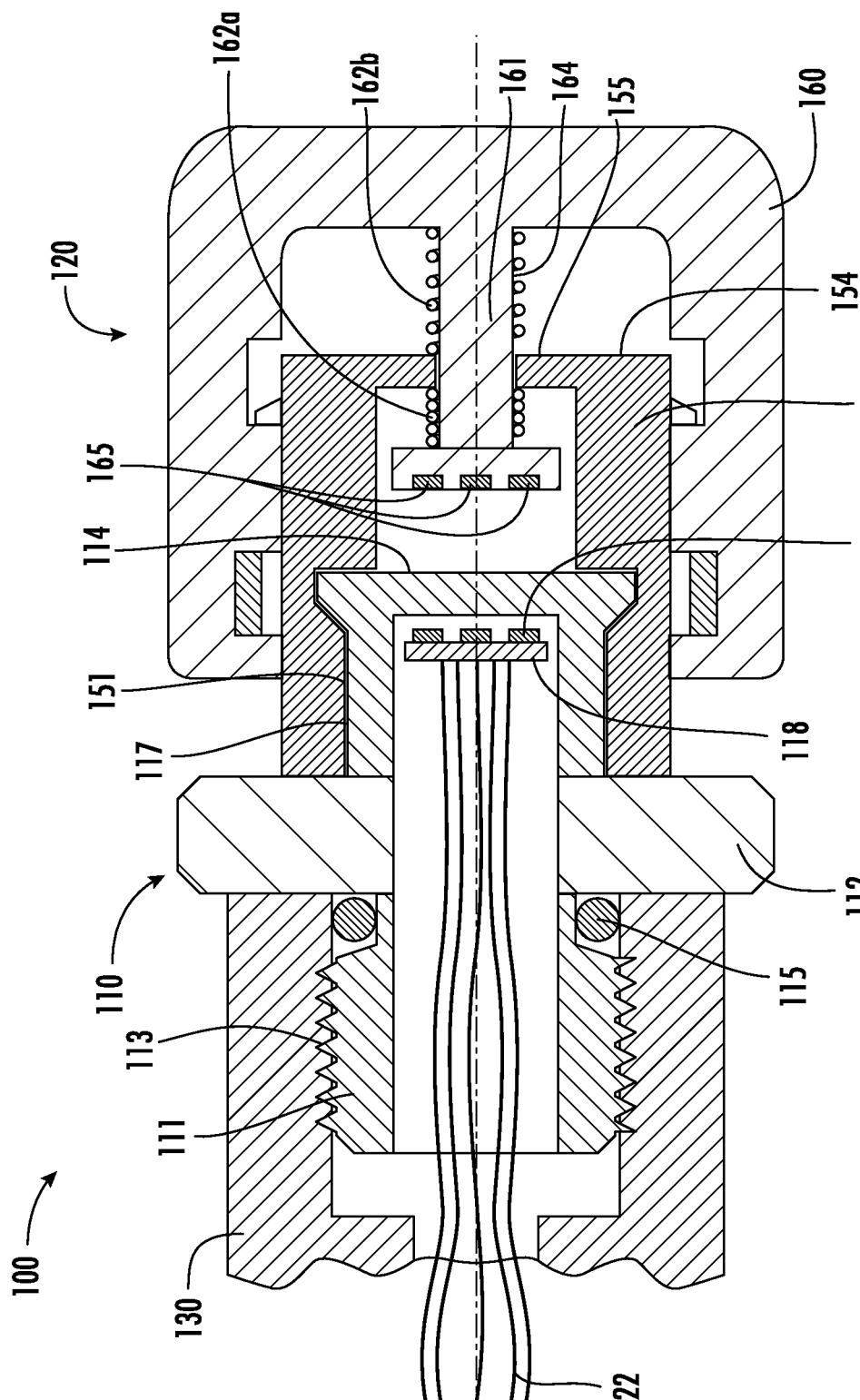
FIG. 1C shows a sectional view of a device menu controls connector according to an embodiment of the present disclosure wherein the knob is in a pulled position.

Shown in FIG. 1C is an embodiment of the device menu controls connector 100 in which the knob 160 of the knob assembly 120 has been pulled away from the field device connection 110. Note the field device connection 110 and the knob assembly 120 remain releasably locked together.

Returning to the structure of the knob 160, the retainer 164 disposed on the cylindrical shaft 161 may be embodied of a non-magnetic material. Like the material of the hollow body 111, the retainer 164 may be embodied of aluminum, stainless steel, or a plastic, for example.

One or more magnets 165 may be disposed on a face of the retainer 164 that faces toward the end face 114 of the cylindrical hollow body 111. The number of magnets 165 on the retainer 164 will correspond to the number of Hall effect sensors 116 disposed on the PCB 118. The magnets 165 will be disposed on the retainer 164 in the same manner as the Hall effect sensors 116 are disposed on the PCB 118. For example, if four Hall effect sensors 116 a disposed equidistantly along the circumference a circle on the PCB 118, and one Hall effect sensor 116 is disposed in the center of the circle on the PCB 118, then four magnets 165 will be disposed equidistantly along the circumference a circle of the same size as the circle of Hall effect sensors 116 on the PCB 118. In addition, one magnet 165 will be disposed in the center of the circle. The magnets 165 along the circumference of the circle may alternate in polarity such that the poles of the magnets 165 alternate north-south-north . . . along the circumference of the circle.

Figure 4:
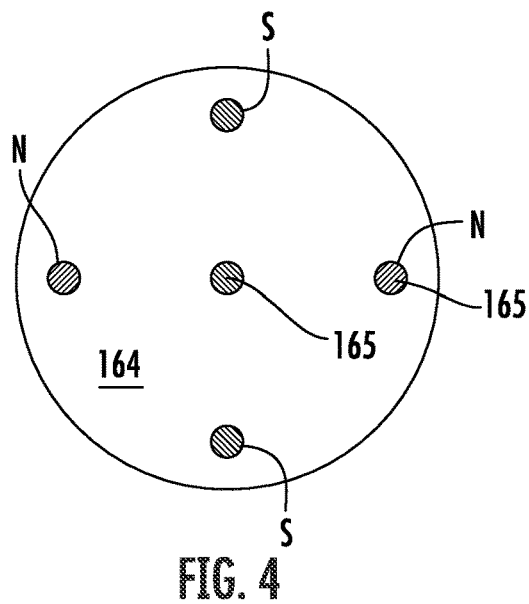
FIG. 4 shows schematically an embodiment of the retainer having five magnet according to an embodiment of the present disclosure.

Shown in FIG. 4 is an embodiment of the retainer 164 having four magnets 165 disposed along a circle and one magnet 165 disposed in the center of the circle. The centers of the circle of Hall effect sensors 116 and the center of the circle of magnets 165 will have the same, or coincident, axes of rotation.

Figure 5:
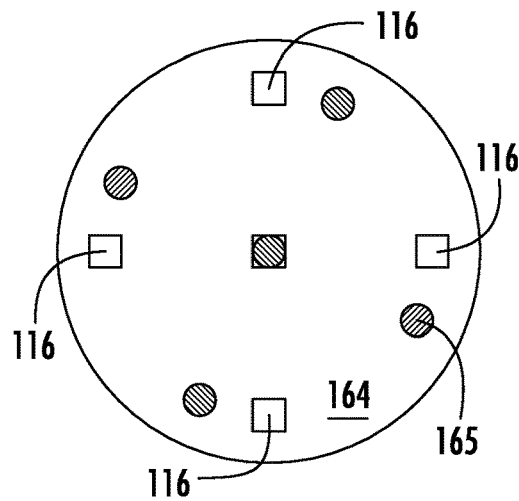
FIG. 5 shows schematically the retainer having five magnets and a PCB having five Hall effect sensors according to an embodiment of the present disclosure.

Shown in FIG. 5 is a view of the retainer 164 in position over the printed circuit board 118. As shown in FIG. 5, as the retainer 164 is rotated about its axis, the magnets 165 of the retainer 164 will pass over the various Hall effect sensors 116 thereby triggering the Hall effect sensors. The magnet in the center of retainer 164 remains in position over the center Hall effect sensor 116 of the printed circuit board 118 as the retainer 164 is rotated. Because in this embodiment the center magnet 165 remains in position over the center Hall effect sensor 116 regardless of the rotation of the retainer 164, the center Hall effect sensor 116 is not used, in this embodiment, to determine any rotation of the retainer 164. Rather, the center Hall effect sensor 116 may be used to measure the relative field strength of the center magnet 165 and thus detect a pushing or pulling action upon the knob 160.

Figure 6:
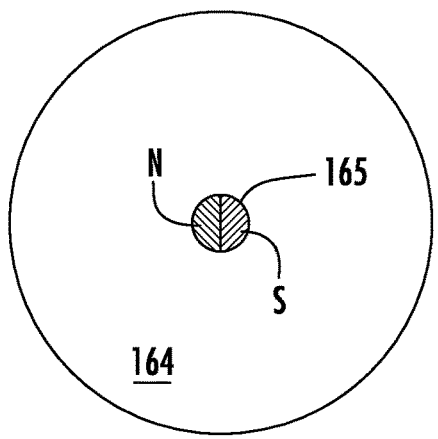
FIG. 6. shows schematically an embodiment of the retainer having a diametrically polarized magnet according to an embodiment of the present disclosure.

In an alternate embodiment of the retainer 164, there is only one magnet 165 disposed on the retainer 164. In this embodiment, the magnet is diametrically polarized (i.e., the north and south poles of the magnet are oriented along a diameter of circle). This embodiment of the retainer 165 and the diametrically polarized magnet 165 may be used with the embodiment of the PCB 118 as shown in FIG. 3 having only the IC containing the Hall effect sensors in place of the plurality of discrete Hall effect sensors disposed on the PCB 118. This embodiment of the retainer 164 having a diametrically polarized magnet 165 is shown in FIG. 6.

When the field device connection 110 is connected to a field device (i.e., installed into a cable gland 130) and the knob assembly 120 is releasably attached to the field device connection 110 via the complementary releasable locking means of the hollow body 111 and the sleeve 150, the magnets 165 on the retainer 164 are disposed near Hall effect sensors 116 of the PCB 118. Movement of the retainer 164 and the magnets 165 disposed thereon may trigger the Hall effect sensors 116.

For example, the turning of the knob 160 about its axis may produce a series of pulses from each of the Hall effect sensors 116 as the magnets 165 on the retainer 164 pass over the Hall effect sensors 116. The pulses from the Hall effect sensors 116 are transmitted to the field device via wires 122, and the field device may decode the pulse streams to determine a direction of rotation, and, if desired, a rotation speed of the knob 160.

The Hall effect sensor 116 disposed in the center of the circle is activated by the magnet 165 disposed in the center of the circle on the retainer 164. This Hall effect sensor 116 is used for measuring the relative field strength of the center magnet 165 on the retainer 164. Therefore this center Hall effect sensor 116 may be used to detect an increasing field strength of the center magnet 165 as the knob 160 is pushed axially toward the field device part 110. In addition, this center Hall effect sensor 116 may be used for the detection of a decreasing field strength of the center magnet 165 as the knob 160 is pulled axially away from the field device part 110.

In an alternate embodiment of the device menu controls connector 100 that includes a field device part 110 that uses a single IC 121 having multiple Hall effect sensors internal to the IC 121 (as shown in FIG. 3) and includes a knob assembly that uses a single, diametrically polarized magnet (as shown in FIG. 6), the rotational and axial movement is detected by the single IC. The signals as determined by the IC 121 are transmitted to the field device via the wires 122.

Figure 7:
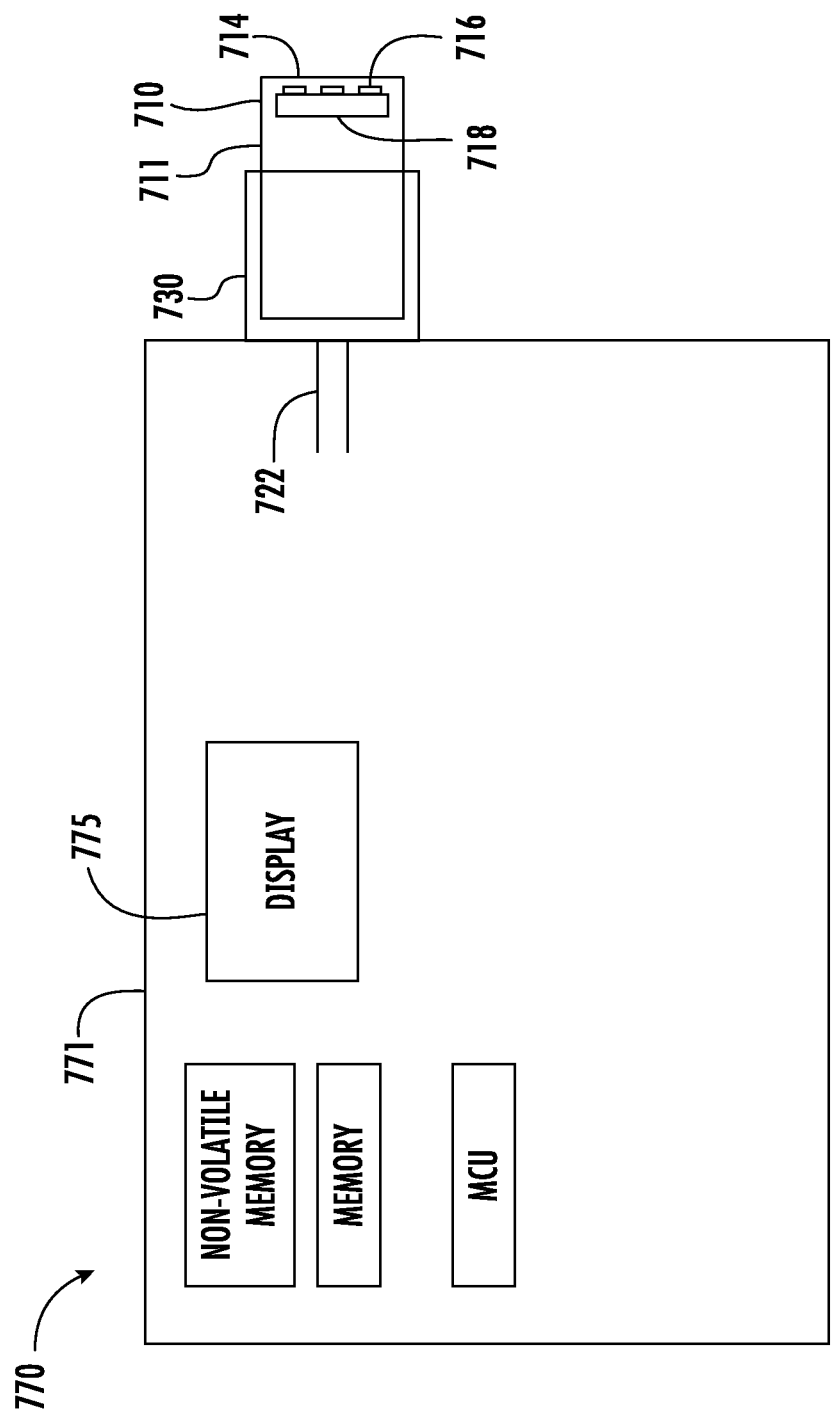
FIG. 7 shows schematically a field device having a device menu controls connector according to an embodiment of the present disclosure.

FIG. 7 shows in schematic an embodiment of a field device 770 according to an embodiment of the present disclosure. The field device 770 includes a field device connection 710 of a device menu controls connector. The field device 770 may have a housing 771 including a cable gland 730, and a field device connection 710 of a device menu controls connector may be attached to the cable gland 730 of the field device 770. Wires 722 may extend from the PCB 718 of the field device connection 710 into the field device housing 771 to electrically connected with various electronic circuits within the field device 770. The electronic components of the field device 770 may include a microprocessor, memory including both non-volatile and volatile, and various interface circuits required by electronic components. The field device 770 may further include a display 775 for showing menus, prompts, etc. of a graphical or text user interface. The field device 770 may be configured to accept user input for the graphical or text user interface shown on the display 775 via a device menu controls connector (as shown in FIG. 1, for example) connected with the field device 770 at the cable gland 730.

A device menu controls connector as shown in FIG. 1 may be connected with a field device 770 as shown in FIG. 7 by connecting the wires/cable 722 of the field device part 710 with a corresponding electrical connection of the field device 770. Thereafter the field device part 710 may be screwed into the cable gland 730 of the field device 770. Because of the sealing ring (not shown in FIG. 7) and because of the closed end face 714, the attaching of the field device part 710 to the cable gland 730 of the field device 770 seals the cable gland 730 against the ingress of any liquid or gas. The material of the cylindrical hollow body 711 including the end face 714 may be adapted to meeting any safety requirements necessary for the field device. The sealing ring may be similarly adapted to meet safety requirements.

The operation of the field device 770 having a field device part 710 is as follows. Reference is made also to the device menu controls connector as shown in FIG. 1 that includes both the field device part 110 and the knob assembly 120.

A knob assembly 120 may be releasably attached to the field device part 110 when the field device part 110 is attached to the field device 770. If the field device part 110 and the knob assembly 120 use ball detents as the releasable locking means, for example, the knob assembly 120 may be simply pushed onto the field device part until the ball detents engage. Alternately, the field device part 110 and the knob assembly may use quarter-turn locking threads or a bayonet type of connection to releasably attach the knob assembly 120 to the field device part 110 that is attached to the field device 770.

When the knob assembly 120 is then attached (releasably) to the field device part 110, the magnets 165 on the retainer 164 are disposed near to the Hall effect sensors 116 and may trigger the Hall effect sensors 116 when the magnets 165 pass over the Hall effect sensors (when the knob 160 is rotated, for example). Signals from the Hall effect sensors are sent via the wires 122 from the field device part 110 to the field device 770 where the signals may be processed by the microprocessor and other circuitry.

When the knob 160 is turned about its axis and the magnets 165 pass over the Hall effect sensors 116, each of the Hall effect sensors 116 sends to the field device 770 an electronic signal containing a pulse train triggered by the magnets 165. The field device 770 receives and processes the pulse trains from all the Hall effect sensors 116 and therefrom determines a rotational direction and rotational speed of the knob 160.

When the knob 160 is moved axially by pushing or pulling the knob 160, the center Hall effect sensor 116 detects the change in the strength of the magnetic field produced by the center magnet 165 and sends corresponding signaling to the field device 770. Thus the field device 770 may determine a pushing or pulling of the knob 160.

Thus from the signals received by the field device 770 from the Hall effect sensors 116, the field device may determine the following: a clock-wise rotation of the knob 160; a counter-clockwise rotation of the knob 160; a pushing action (i.e., an axial movement toward the field device 770) of the knob 160, and a pulling action (i.e., an axial movement away from the field device 770) of the knob 160.

The field device 770 is programmed to process a pushing of the knob 160 as simulating an <Ok> or <Enter> or similar key press. The field device 770 is programmed to process a pulling of the knob 160 as simulating an <Esc> or <Back> or similar key press. The field device 770 is programmed to process the clockwise rotation of the knob 160 as a <+> or <Down> or similar key press. The field device 770 is programmed to process the counter-clockwise motion of the knob 160 as a <−> or <Up> or similar key press. Therefore, by the pushing, pulling, and turning of a single knob a user is enabled to navigate a user interface of a process automation field device.

Because the field device part 110 is screwed to a cable gland and seals the cable gland, and because the knob assembly 120 is removably attached to the field device part 110, a user such as a service technician may service one or more field devices 770 by removably attaching the knob assembly 120 to each of the field devices successively. No opening of the field device 770 is necessary for the attachment of the knob assembly 120.

Until the knob assembly 120 is attached to the field device part 110 on a field device 770, the Hall effect sensors 116 do not produce any signals for the field device 770. Therefore, the field device 770 may be programmed to disable its user interface functionality in the absence of signals from all the Hall effect sensors 116. In this state, user input to the field device 770 is locked out from user input.

But when the knob assembly 120 is attached to the field device part 110, the magnets 165 of the knob assembly 120 trigger the Hall effect sensors 116. When the field device 770 receives from the field device part 110 the pulses from all the Hall effect sensors 116, the field device 770 may enable user input and allow access to the menu system of the field device 770. The field device 770 may perform this enabling of the user input only when a characteristic signal is received from the field device part 110 (e.g., when a signal from all Hall effect sensors 116 is received) to prevent inadvertent or illicit attempts to access the field device 770. In addition, when this signal from the field device part 110 is lost or no longer detected, i.e., when the knob assembly has been removed, the field device 770 may again disable the user input.

What is claimed:

1. A device menu controls connector, comprising:
  a field device part, including:
    a cylindrical hollow body having an open first end, a closed second end, a flange disposed circumferentially about the hollow body between the first end and the second end, and a first locking means disposed at the second end;
    an elastomer sealing ring disposed circumferentially about the hollow body adjacent to a side of the flange facing the first end;
    a printed circuit board (PCB) having at least one Hall effect sensor, the PCB disposed inside the hollow body such that the at least one Hall effect sensor is adjacent to an inside face of the closed second end; and
    a plurality of conductors extending from the PCB and embodied to carry electrical signals between the PCB and electronic circuits of a process automation field device;
    wherein the field device part is embodied to thread at the first end into a cable gland of the process automation field device until the flange contacts the cable gland and compresses the elastomer sealing ring to seal the cable gland; and
  a knob assembly, including:
    a cylindrical sleeve having an open first end, a partially closed second end, and a second locking means disposed inside the first end, wherein the second locking means is complementary to the first locking means;
    a cylindrical knob having an open first end, a closed second end, and a shaft disposed along an axis of rotation of the knob and extending from the closed second end into an interior of the knob;
    a first coil spring and a second coil spring disposed about the shaft;
    a retainer disposed at a distal end of the shaft; and
    at least one magnet disposed on the retainer,
    wherein the sleeve and knob are assembled such that:
      the first end of the knob fits over at least partially the second end of the sleeve and the axis of rotation of the knob coincides with an axis of rotation of the sleeve;

the shaft of the knob extends into the partially closed second end of the sleeve, the first spring is disposed between the retainer and an interior face of the second end of the sleeve, and the second spring is disposed between an exterior face of the second end of the sleeve and an interior face of the second end of the knob;

the knob may rotate freely about the sleeve and may move axially with respect to the sleeve;

an axial movement of the knob away from the sleeve compresses the first spring between the retainer and the interior face of the second end of the sleeve; and an axial movement of the knob toward the sleeve compresses the second spring between the exterior face of the second end of the sleeve and the interior face of the second end of the knob, wherein the knob assembly is embodied to releasably lock onto the field device part via the first locking means and the second locking means, and the releasable locking is such that the sleeve of the knob assembly does not move with respect to the hollow body of the field device part, and wherein when the knob assembly is releasably locked onto the field device part the at least one magnet is disposed near the at least one Hall effect sensor such that movement of the knob triggers the at least one Hall effect sensor.

2. The device menu controls connector as claimed in claim 1, wherein the PCB includes a plurality of Hall effect sensors: all but one of the plurality of Hall effect sensors are disposed equidistantly along a circumference of a circle, and one Hall effect sensor is disposed in a center of the circle, and wherein the retainer includes a plurality of magnets equal in number to the plurality of Hall effect sensors, and all but one of the magnets are disposed along a circumference of a circle on the retainer with one magnet disposed in a center of the circle on the retainer, wherein the circumferences of the two circles are equal, centers of the two circles coincide, and the centers of the two circles coincide with the axis of rotation of the knob, and wherein polarity of the magnets disposed along the circle on the retainer alternates between north and south along the circumference of the circle.

3. The device menu controls connector as claimed in claim 1, wherein the at least one Hall effect sensor is an integrated circuit (IC) containing a plurality of Hall effect sensors, wherein the at least one magnet is a diametrically polarized magnet, and wherein the IC and the diametrically polarized magnet are disposed on the axis of rotation of the knob.

4. The device menu controls connector as claimed in claim 1, wherein when the knob assembly is releasably attached to the field device part and the knob is rotated with respect to the field device part clockwise about the knob's axis, the at least one Hall effect sensor encodes a first pulse train and sends the first pulse train to the field device via the plurality of conductors, and wherein when the knob assembly is releasably attached to the field device part and the knob is rotated with respect to the field device part counter-clockwise about the knob's axis, the at least one Hall effect sensor encodes a second pulse train different from the first pulse train and sends the second pulse train to the field device via the plurality of conductors.

5. The device menu controls connector as claimed in claim 1, wherein when the knob assembly is releasably attached to the field device part and the knob is pushed axially toward the field device part, the at least one Hall effect sensor encodes a push signal and sends the push signal to the field device via the plurality of conductors, and wherein when the knob assembly is releasably attached to the field device part and the knob is pulled axially away from the field device part, the at least one Hall effect sensor encodes a pull signal and sends the pull signal to the field device via the plurality of conductors.

6. A process automation field device, comprising:

a control electronics including a microcontroller and a memory;

a display embodied to display a text or graphical user interface (UI);

a housing having a window and a cable gland, wherein the housing encloses the control electronics and the display, and wherein the display is visible via the window; and a field device part of a device menu controls connector, the field device part including:

a cylindrical hollow body having an open first end, a closed second end, a flange disposed circumferentially a bout the hollow body between the first end and the second end, and a first locking means disposed at the second end;

an elastomer sealing ring disposed circumferentially about the hollow body adjacent to a side of the flange facing the first end;

a printed circuit board (PCB) having at least one Hall effect sensor, the PCB disposed inside the hollow body such that the at least one Hall effect sensor is adjacent to an inside face of the closed second end; and a plurality of conductors extending from the PCB and embodied to carry electrical signals between the PCB and the control electronics of the field device;

wherein the field device part is threaded at the first end into the cable gland and the flange contacts the cable gland and compresses the elastomer sealing ring to seal the cable gland.

7. The field device as claimed in claim 6, wherein the field device is programmed to process:

a first pulse train encoded by the at least one Hall effect sensor as a rightward or a downward navigation of the field device's UI, a second pulse train encoded by the at least one Hall effect sensor and different from the first pulse train as a leftward or an upward UI navigation, an increasing magnetic field as encoded by the at least one Hall effect sensor as an <Enter> or <Select> UI navigation, and a decreasing magnetic field as encoded by the at least one Hall effect sensor as an <Escape> or <Back> UI navigation.

8. The field device as claimed in claim 7, wherein the field device is further programmed to detect an attachment of a knob assembly to the field device part by detecting a triggering of the at least one Hall effect sensor by at least one magnet, the knob assembly including:

a cylindrical sleeve embodied to removably attach to the field device part;

a cylindrical knob having an axis of rotation, the knob disposed about the sleeve and embodied to rotate with respect to the sleeve about the knob's axis of rotation and to move axially with respect to the sleeve along the knob's axis of rotation; and at least one magnet disposed on the knob such that when the knob assembly is removably attached to the field device part, the at least one magnet is disposed adjacent to the closed second end of the cylindrical hollow body and the PCB disposed therein, wherein the field device is further programmed to detect a removal of the knob assembly by detecting an absence of triggering of the at least one Hall effect sensor for a predetermined absence time, wherein the field device is further programmed to enable and display the field device's UI when the field device detects the attachment of the knob assembly, and wherein the field device is further programmed to disable the field device's UI when the field device detects the removal of the knob assembly.

* * * * *